United States Patent
Engesser et al.

(10) Patent No.: US 9,870,933 B2
(45) Date of Patent: Jan. 16, 2018

(54) PROCESS AND APPARATUS FOR TREATING SURFACES OF WAFER-SHAPED ARTICLES

(71) Applicant: LAM RESEARCH AG, Villach (AT)

(72) Inventors: Philipp Engesser, Lindau (DE); David Henriks, Villach (AT); Anders Joel Bjoerk, Villach (AT)

(73) Assignee: LAM RESEARCH AG, Villach (AT)

( * ) Notice: Subject to any disclaimer, the term of this patent is extended or adjusted under 35 U.S.C. 154(b) by 18 days.

(21) Appl. No.: 13/762,681

(22) Filed: Feb. 8, 2013

(65) Prior Publication Data
US 2014/0227884 A1   Aug. 14, 2014

(51) Int. Cl.
*H01L 21/306* (2006.01)
*H01L 21/67* (2006.01)
*H01L 21/02* (2006.01)

(52) U.S. Cl.
CPC .... *H01L 21/6708* (2013.01); *H01L 21/67248* (2013.01); *H01L 21/02057* (2013.01); *H01L 21/67051* (2013.01); *H01L 21/67075* (2013.01)

(58) Field of Classification Search
USPC ............ 156/345.55, 345.15, 345.21, 345.17, 156/345.37; 118/730, 666, 72
See application file for complete search history.

(56) References Cited

U.S. PATENT DOCUMENTS

| 4,903,717 A | 2/1990 | Sumnitsch |
| 5,513,668 A | 5/1996 | Sumnitsch |
| 5,938,847 A * | 8/1999 | Akimoto et al. ............. 118/665 |
| 6,306,455 B1 * | 10/2001 | Takamori .......... H01L 21/67248 118/52 |
| 6,376,013 B1 * | 4/2002 | Rangarajan ............. B05C 11/02 118/319 |
| 6,485,531 B1 | 11/2002 | Schob |
| 6,566,275 B1 * | 5/2003 | Moon ................... G03F 7/3021 438/745 |
| 6,805,769 B2 * | 10/2004 | Okuda et al. ............ 156/345.12 |
| 6,834,440 B2 | 12/2004 | Lee |
| 6,858,084 B2 * | 2/2005 | Inoue et al. .................. 118/666 |
| 7,004,181 B2 * | 2/2006 | Isago ...................... B01F 3/022 134/102.1 |
| 7,017,281 B2 | 3/2006 | Izumi |

(Continued)

FOREIGN PATENT DOCUMENTS

| JP | 2007088381 A * | 4/2007 |
| WO | 2007/101764 A1 | 9/2007 |
| WO | 2010/113089 A2 | 10/2010 |

OTHER PUBLICATIONS

Machine Generated English Translation of JP 2007-088381A. Published Apr. 25, 2007.*

*Primary Examiner* — Sylvia R MacArthur (57) ABSTRACT

An apparatus and method for processing wafer-shaped articles utilizes at least first and second liquid-dispensing nozzles, wherein a first liquid-dispensing nozzle is positioned closer to an axis of rotation than the second liquid-dispensing nozzle. A liquid supply system supplies heated process liquid to the nozzles such that process liquid dispensed from the first nozzle has a temperature that differs by an amount within a predetermined range from a temperature of process liquid dispensed from the second liquid-dispensing nozzle.

1 Claim, 5 Drawing Sheets

(56) References Cited

U.S. PATENT DOCUMENTS

| | | | |
|---|---|---|---|
| 7,635,417 B2* | 12/2009 | Lin | H01L 21/6708 134/104.1 |
| 8,398,817 B2* | 3/2013 | Namba | H01L 21/0209 156/345.21 |
| 8,864,933 B2* | 10/2014 | Terada | H01L 21/31055 118/715 |
| 2005/0221621 A1* | 10/2005 | Mikhaylichenko | B08B 3/02 438/745 |
| 2006/0086373 A1 | 4/2006 | Park | |
| 2007/0017555 A1* | 1/2007 | Sekiguchi | B08B 3/02 134/33 |
| 2009/0136670 A1* | 5/2009 | Choi | H01L 21/67248 427/314 |
| 2009/0229641 A1* | 9/2009 | Yoshida | H01L 21/67051 134/107 |
| 2010/0122772 A1* | 5/2010 | Hayashi | H01L 21/67051 156/345.21 |
| 2011/0143550 A1* | 6/2011 | Saito | G03F 7/423 438/750 |
| 2011/0230054 A1* | 9/2011 | Tomita | H01L 21/02052 438/758 |
| 2011/0253181 A1 | 10/2011 | Obweger et al. | |
| 2012/0074102 A1* | 3/2012 | Magara | C11D 7/08 D7/8 |
| 2012/0080061 A1* | 4/2012 | Kim | F26B 5/005 134/95.2 |
| 2012/0213914 A1* | 8/2012 | Ivanov et al. | 427/58 |
| 2012/0260949 A1* | 10/2012 | Sekiguchi | C11D 7/5004 134/22.19 |
| 2013/0014787 A1* | 1/2013 | Urata | H01L 21/31133 134/100.1 |
| 2013/0078809 A1* | 3/2013 | Yu | H01L 21/6708 438/689 |
| 2014/0137908 A1* | 5/2014 | Kollmann | H01L 21/6715 134/172 |

* cited by examiner

PROCESS AND APPARATUS FOR TREATING SURFACES OF WAFER-SHAPED ARTICLES

BACKGROUND OF THE INVENTION

1. Field of the Invention

The invention relates generally to processes and apparatus for treating surfaces of wafer-shaped articles, such as semiconductor wafers, wherein one or more treatment liquids are dispensed onto a surface of the wafer-shaped article.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

In either type of device, process liquids are dispensed onto one or both major surfaces of the semiconductor wafer as it is being rotated by the chuck. Such process liquids may for example be strong oxidizing compositions such as mixtures of sulfuric acid and peroxide for cleaning surfaces of the semiconductor wafer. Such process liquids typically also include deionized water to rinse the wafer between processing steps, and the deionized water is commonly supplemented with isopropyl alcohol to reduce the surface tension of the rinse liquid on the wafer.

As the dimensions of the semiconductor devices formed on these wafers continue to decrease, new demands are made on the equipment for processing the wafers. Smaller device structures are more susceptible to "pattern collapse" when the surface tension of the rinse liquid or other processing liquid on the wafer is too great, a problem which arises from not only the reduced device dimensions but also from the typically higher aspect ratios that accompany smaller device structures.

These problems are exacerbated by the concurrent trend of increasing wafer diameter. Fabrication plants designed for semiconductor wafers of 200 mm diameter are increasingly giving way to those utilizing semiconductor wafers of 300 mm diameter, and development for the next generation of 450 mm wafers in underway. As the process liquids travel across larger wafer diameters, the potential increases for variations in the temperature and viscosity of the liquid as a function of distance from the point of dispensing, which can lead to inconsistent process performance.

Conventional wafer processing devices have included dispensing nozzles mounted on a swinging boom arm, so that the point of dispensing can be moved across the surface of the wafer, and have also included plural movable nozzles and showerheads as shown for example in U.S. Pat. Nos. 6,834,440 and 7,017,281 and U.S. Published Patent Appln. No. 2006/0086373. However, these approaches do not necessarily afford sufficient control over the behavior and physical properties of the liquid across the wafer surface.

SUMMARY OF THE INVENTION

Thus, the invention in one aspect relates to an apparatus for processing wafer-shaped articles, comprising a rotary chuck adapted to hold a wafer shaped article of a predetermined diameter thereon and to rotate the wafer shaped article about an axis of rotation, at least first and second liquid-dispensing nozzles that are mounted so as to be stationary relative to one another, wherein the first liquid-dispensing nozzle is positioned closer to the axis of rotation than the second liquid-dispensing nozzle, and a liquid supply system configured to supply process liquid to the first and second liquid-dispensing nozzles, the liquid supply system comprising one or more heaters, and the liquid supply system being configured to heat and supply process liquid such that process liquid dispensed from the first liquid-dispensing nozzle has a temperature that differs by an amount within a predetermined range from a temperature of process liquid dispensed from the second liquid-dispensing nozzle.

In preferred embodiments of the apparatus according to the present invention, the first and second liquid-dispensing nozzles are mounted such that the nozzles are movable conjointly in a direction perpendicular to the axis of rotation.

In preferred embodiments of the apparatus according to the present invention, the liquid supply system and the first and second liquid-dispensing nozzles are configured such that a higher flow rate of process liquid is supplied to the second liquid-dispensing nozzle than to the first liquid-dispensing nozzle.

In preferred embodiments of the apparatus according to the present invention, the second liquid-dispensing nozzle is positioned radially outwardly of the axis of rotation by a distance of about 30% of the predetermined diameter.

In preferred embodiments of the apparatus according to the present invention, the liquid supply system is configured to supply a same process liquid to each of the first and second liquid-dispensing nozzles.

In preferred embodiments of the apparatus according to the present invention, the liquid supply system comprises at least two individually controllable heaters, and each of the at least two individually controllable heaters acts on process liquid supplied to a respective one of the first and second liquid-dispensing nozzles.

In preferred embodiments of the apparatus according to the present invention, the liquid supply system is configured to supply a different process liquid to each of the first and second liquid-dispensing nozzles.

In preferred embodiments of the apparatus according to the present invention, the liquid supply system further comprises a temperature sensing system for monitoring temperatures on a wafer-shaped article when held by the rotary chuck, and wherein the liquid supply system is configured to adjust at least one of a temperature and a process liquid flow rate for each of the first and second liquid-dispensing nozzles, based on temperatures monitored by the temperature sensing system.

In preferred embodiments of the apparatus according to the present invention, the apparatus further comprises at least a third liquid-dispensing nozzle, and the liquid supply system is configured to supply a same process liquid to each of the first, second and third liquid-dispensing nozzles, and the one or more heaters comprises a heating element configured to apply a heating gradient to process liquid supplied to the first, second and third liquid-dispensing nozzles.

In preferred embodiments of the apparatus according to the present invention, the apparatus further comprises at least third and fourth liquid-dispensing nozzles, and the liquid supply system is configured to supply a same process liquid to each of the first through fourth liquid-dispensing nozzles through a manifold, and the liquid supply system provides process liquid at respectively different temperatures and pressures to first and second manifold inlets, thereby to generate a temperature gradient in process liquid supplied to the first through fourth liquid-dispensing nozzles via competing backpressure.

In another aspect, the present invention relates to a method for processing wafer-shaped articles, comprising positioning a wafer shaped article of a predetermined diameter on a rotary chuck and rotating the wafer shaped article about an axis of rotation, dispensing process liquid onto the wafer-shaped article through at least first and second liquid-dispensing nozzles, wherein the first liquid-dispensing nozzle is positioned closer to the axis of rotation than the second liquid-dispensing nozzle, and controlling at least one of a flow rate and temperature of process liquid dispensed from the first and second liquid-dispensing nozzles such that process liquid dispensed in a more central region of the wafer-shaped article has a temperature that differs by an amount within a predetermined range from a temperature of process liquid dispensed in a more peripheral region of the wafer-shaped article.

In preferred embodiments of the method according to the present invention, the first and second liquid-dispensing nozzles are moved relative to one another in a direction perpendicular to the axis of rotation, during the dispensing.

In preferred embodiments of the method according to the present invention, a process liquid comprising sulphuric acid is dispensed from one of the first and second liquid-dispensing nozzles, and a process liquid comprising hydrogen peroxide is dispensed from the other of the first and second liquid-dispensing nozzles.

In preferred embodiments of the method according to the present invention, the dispensing comprises discharging process liquid simultaneously through each of the first and second liquid-dispensing nozzles.

In preferred embodiments of the method according to the present invention, the process liquid dispensed through the second liquid-dispensing nozzle is heated to a higher temperature than process liquid dispensed through the first liquid-dispensing nozzle.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

In single wafer wet processing of semiconductor wafers, the uniformity of the process, for example with respect to etch rate, material loss, etc., is one of the key characteristics contributing to the quality of the processed wafer. In some processes uniformity is important from the standpoint of throughput, whereas in others uniformity is important for the electrical properties of the devices formed on the wafer.

A main reason for variation in etch results within a given wafer and from one wafer to the next is when there exists a gradient in temperature over the wafer surface. Concentration gradients may also contribute to non-uniform process results. For example, during back side film removal, non-uniform etching normally takes the form of higher etching in the center of the wafer and lower etching at the periphery of the wafer, and results in longer process times, and lower throughput.

As another example, front-end-of-line (FEOL) cleaning with SC1 (where SC stands for Standard Clean, typically performed with a 1:1:5 solution of $NH_4OH+H_2O_2+H_2O$ at 75 or 80° C. for about 10 minutes) will always cause a material loss for example of $SiO_2$ if the temperature on the wafer is not uniform, and that loss will be lower at the cold areas and higher in the warmer areas of the wafer. Also, the cleaning efficiency would be less in the cold areas. The inefficient cleaning and non-uniform etching can cause changes in electrical performance of the devices formed on the wafer, and may reduce yield.

Figure 1:
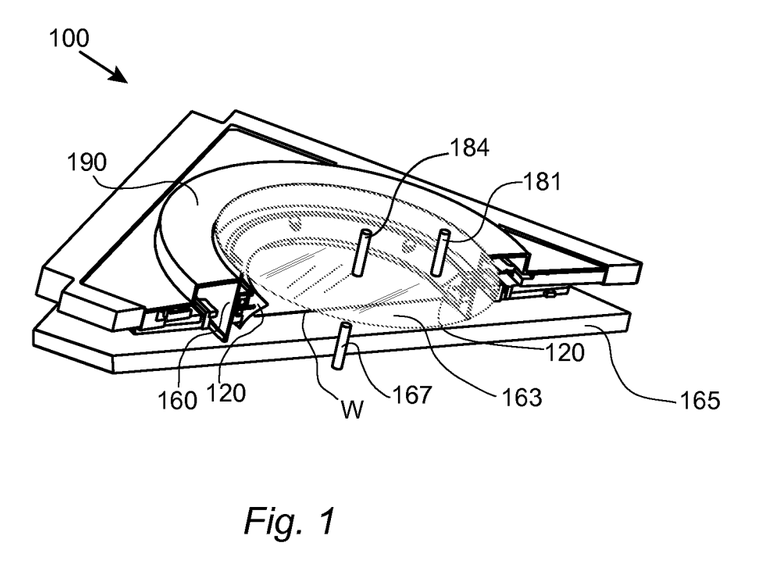
FIG. 1 is an explanatory perspective view of one embodiment of the apparatus according to the present invention.

Referring now to FIG. 1, shown therein is an apparatus for treating surfaces of wafer-shaped articles according to a first embodiment of the invention. The overall structure illustrated in FIG. 1 is similar to the apparatus shown in FIGS. 2a-2f of commonly-owned U.S. Patent Application Pub. No. 2011/0253181 (corresponding to WO 2010/113089). In FIG. 1, the device 100 comprises a chamber defined by lower plate 165, upper transparent cover 163, and cylindrical wall 160 extending therebetween. The annular chuck 120 positioned within the chamber is levitated and rotated magnetically in cooperation with a stator surrounding the chamber and enclosed within stator housing 190.

A lower dispensing tube 167 is led through the bottom plate 165 of the chamber. Reference numerals 184 and 181 denote first and second liquid-dispensing nozzles for supplying process liquid (e.g. hydrofluoric acid) to an upper surface of wafer W. Each of nozzles 184 and 181 passes through the transparent cover 163 and has an orifice at its lower end opening into the chamber.

Figure 2:
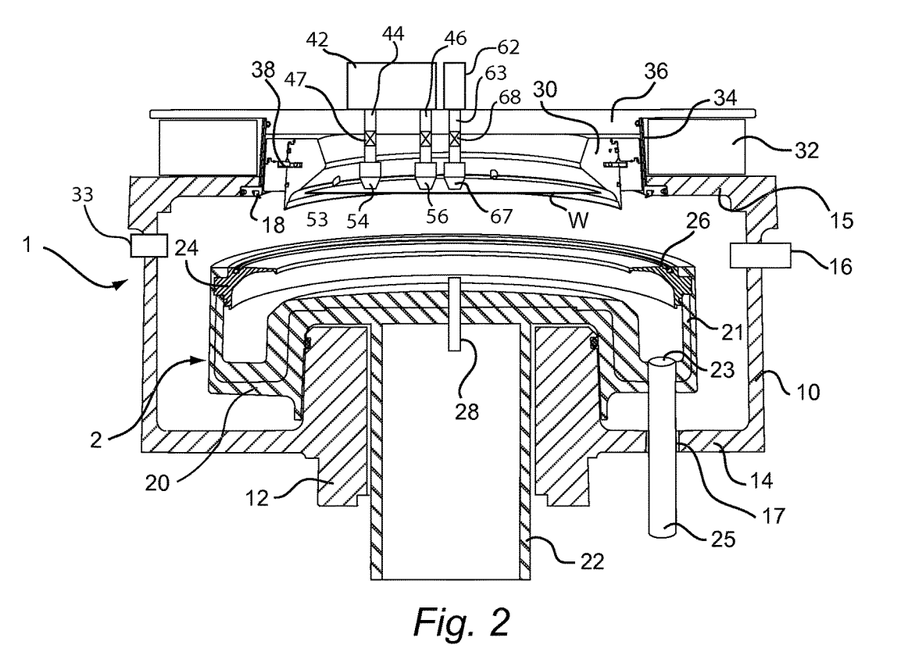
FIG. 2 is an explanatory cross-sectional side view of a process chamber according to a second embodiment of the invention, with the interior cover shown in its first position.

The embodiment depicted in FIG. 2 comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 34 serve as a motor by which the ring rotor 30 (and thereby a supported wafer W) may be rotated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a manifold 42 mounted on its exterior, which supplies a pair of conduits 44, 46 that traverse the lid 36 and terminate in respective nozzles 54, 56 whose openings are adjacent the upper surface of wafer W. It will be noted that the wafer W in this embodiment hangs downwardly from the rotary chuck 30, supported by the gripping members 40, such that fluids supplied through nozzles 54, 56 would impinge upon the upwardly facing surface of the wafer W.

Each conduit 44, 46 is optionally equipped with its own valve 47, only one of which is labeled in FIG. 2 for the sake of clarity. Valves 47 are individually computer controlled, as will be described in more detail hereinafter. Alternatively, a valve could be positioned only upstream of the manifold 42, such that conduits 44, 46 are supplied in common.

A separate liquid manifold 62 supplies liquid to a single central nozzle 67, via conduit 63. Conduit 63 is equipped with its own computer-controlled valve 68.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

Manifold 42 incorporates a heater that heats the process liquid to be dispensed through nozzles 54, 56 to respectively different temperatures. For an apparatus that seeks to produce the same etch rates from center to bevel, nozzle 56 would be mounted on or adjacent the axis of rotation of the chuck 30, and nozzle 54 would be mounted at a radial distance from the axis of rotation of about 30% of the diameter of the wafer W to be treated. Thus, for a 300 mm wafer, the nozzle 54 would be mounted above a point about 90 mm from the center of the wafer. A greater number of nozzles may be provided if desired, in which case they are preferably distributed with equal spacing from the wafer center to the wafer edge.

Manifold 42 preferably but not necessarily also controls the respective flow rates through nozzles 54, 56 according to the wafer area to be treated. For a center nozzle 56 and a nozzle at 30% of the diameter, preferably 25% of the total flow is provided to the central nozzle 56 and 75% of the flow is provided to the outer nozzle 54.

Nozzles 54, 56 and 67 may if desired be mounted for axial movement relative to one another and lid 36; however, they are preferably fixed in this embodiment, because movement in the axial direction would confer no particular advantage, and because such movement would constitute a potential source of particulate contamination interiorly of the chamber.

Similarly, nozzles 54, 56 may be adjustable as to their radial position when lid 36 is removed from the apparatus 1; however, in their process position illustrated in FIG. 2, they are not movable in the radial direction relative to one another or relative to lid 36. This stationary mounting similarly prevents particulate contamination of the chamber ambient.

Although nozzles 54, 56, 67 are illustrated as extending a distance into the interior of the process chamber, it is presently preferred that the discharge openings of these nozzle be approximately flush with the inside surface of the lid 36.

The apparatus of FIG. 2 further comprises an interior cover 2, which is movable relative to the process chamber 1. Interior cover 2 is shown in FIG. 2 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal. An exhaust opening 16 traverses the wall 10 of chamber 1, and is connected to a suitable exhaust conduit (not shown).

The position depicted in FIG. 2 corresponds to loading or unloading of a wafer W. In particular, a wafer W can be loaded onto the rotary chuck 30 either by removing the lid 36, or, more preferably, through a side door 33 in the chamber wall 10. However, when the lid 36 is in position and when side door 33 has been closed, the chamber 1 is gas-tight and able to maintain a defined internal pressure.

Figure 3:
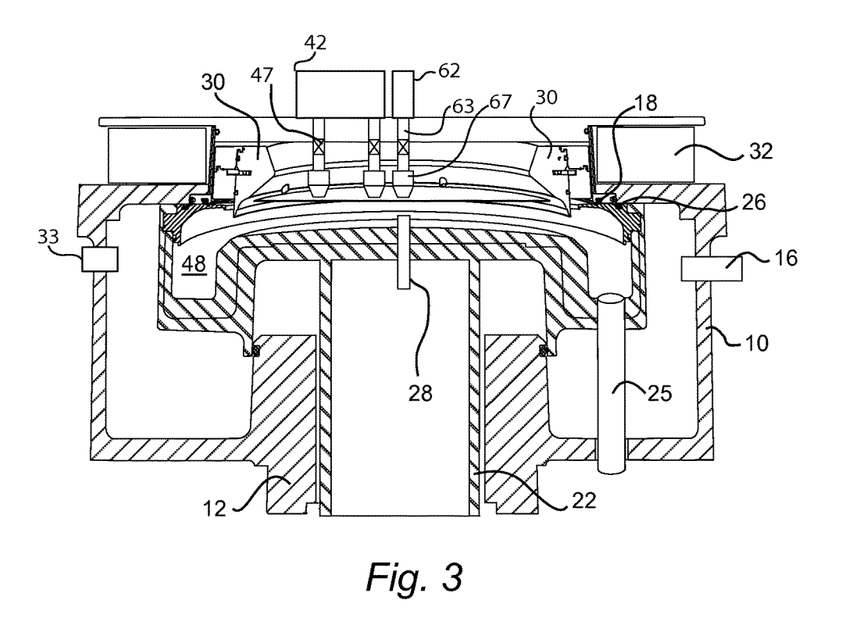
FIG. 3 is an explanatory cross-sectional side view of a process chamber according to the second embodiment of the invention, with the interior cover shown in its second position.

In FIG. 3, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1.

During processing of a wafer, processing fluids may be directed through nozzles 54, 56, 67 and/or 28 to a rotating wafer W in order to perform various processes, such as etching, cleaning, rinsing, and any other desired surface treatment of the wafer undergoing processing.

Figure 4:
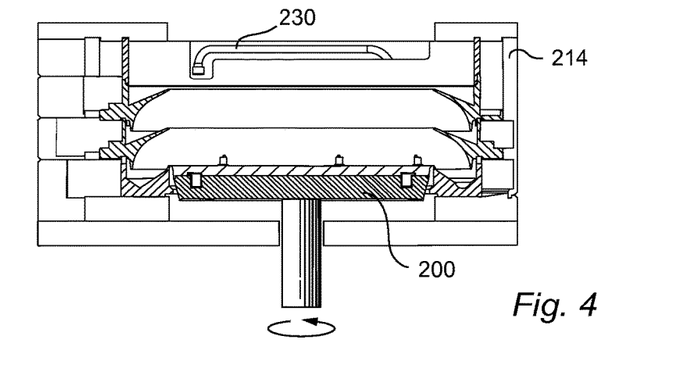
FIG. 4 is an explanatory cross-sectional side view of an apparatus according to a third embodiment of the invention.
Figure 5:
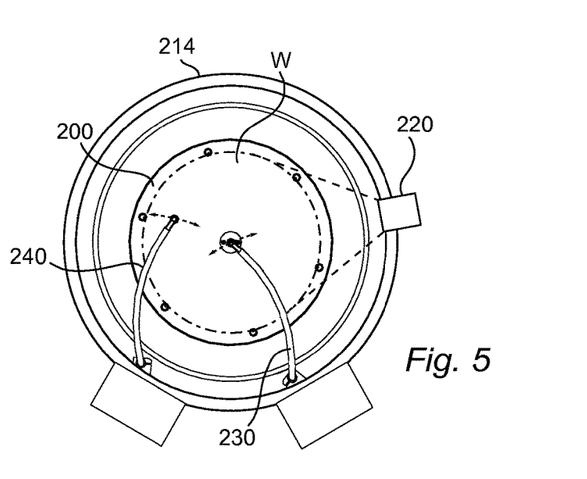
FIG. 5 is a top plan view of the apparatus of FIG. 4.
Figure 6:
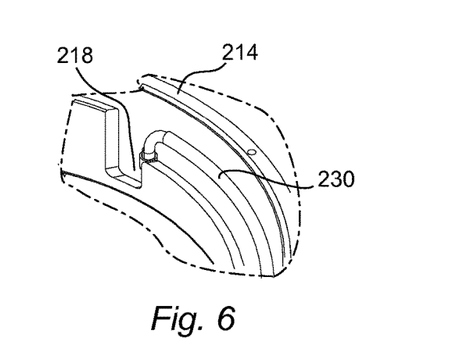
FIG. 6 is a perspective detail of the standby position of one of the liquid-dispensing nozzles of FIG. 5.

In FIGS. 4-6, another embodiment of the apparatus according to the invention includes a spin chuck 200 that is not enclosed in a sealed process chamber but rather is surrounded by a multi-level collector 214 that collects expelled process liquid and exhaust gases at each of three different process levels. Dispense arms 230 and 240 are in this embodiment configured to operate as boom swings, and thus move horizontally relative to and across the rotating wafer, as shown in FIG. 5.

As can be seen in FIG. 4, the collector 214 may include multiple levels, with the chuck 200 and collector 214 being movable relative to one another along the rotation axis of the chuck 200, so as to position the chuck at each of the levels as desired. This positioning may be accomplished by moving the chuck or by moving the collector 214, for example by means of hydraulic jacks on which the collector is mounted.

In FIG. 5, the apparatus includes two dispense arms 230 and 240, which are the same in construction and may be supplied with the same process fluid but heated to respectively different temperatures as discussed in connection with the preceding embodiments. Each dispense arm is movable along an arcuate path as shown in broken line in FIG. 5.

An example of use of the apparatus of FIGS. 4-6 is in the removal of post ash polymers by an SPM (sulfuric acid-hydrogen peroxide mixture) process. The most important parameter for SPM processes is temperature. One of the techniques used to achieve high on-wafer temperature in SPM processes is point of use mixing of $H_2O_2$ with $H_2SO_4$. The exothermic mixing reaction results in temperatures in excess of 150° C.

However, when such a process is performed in the conventional manner, cooling effects can decrease the efficiency of the removal of the polymers.

In the embodiment of FIGS. 4-6, the first nozzle, attached to boom swing 230, moves in an arc of about +−20% of the wafer diameter, centered on the axis of rotation of chuck 200. The second nozzle, attached to boom swing 240, moves along an arc between a position that is offset from the central axis by 30% of the wafer diameter, to an extreme peripheral position that is at 90% of the radius of the wafer. To get the same etch rates at center and edge the fluid from the second nozzle (on boom swing 240) should have a higher temperature than the fluid from the first nozzle (on boom swing 230).

Alternatively, in an SPM process, the first nozzle could supply hot SPM (which itself could be pre-mixed, or point-of-use mixed), and the second nozzle could supply $H_2O_2$ or water. The flow from the second nozzle would mix with flow from the first nozzle and that mixing would cause an increase in temperature.

FIG. 5 also shows an IR camera 220 mounted on the apparatus, so that the whole wafer W is in view, whereby the temperature gradient across the wafer surface can be visualized and/or algorithmically analyzed. A feedback loop can be created to adjust parameters such as boomswing(s), first and second nozzle flow, first and second nozzle medium temperature, and possibly even exhaust flow, to achieve optimum uniformity.

In FIG. 6, boom swing 230 has been moved to its standby position, where it passes through a notch 218 in collector 214, and overlies a drain for collecting excess process liquid.

Figure 7:
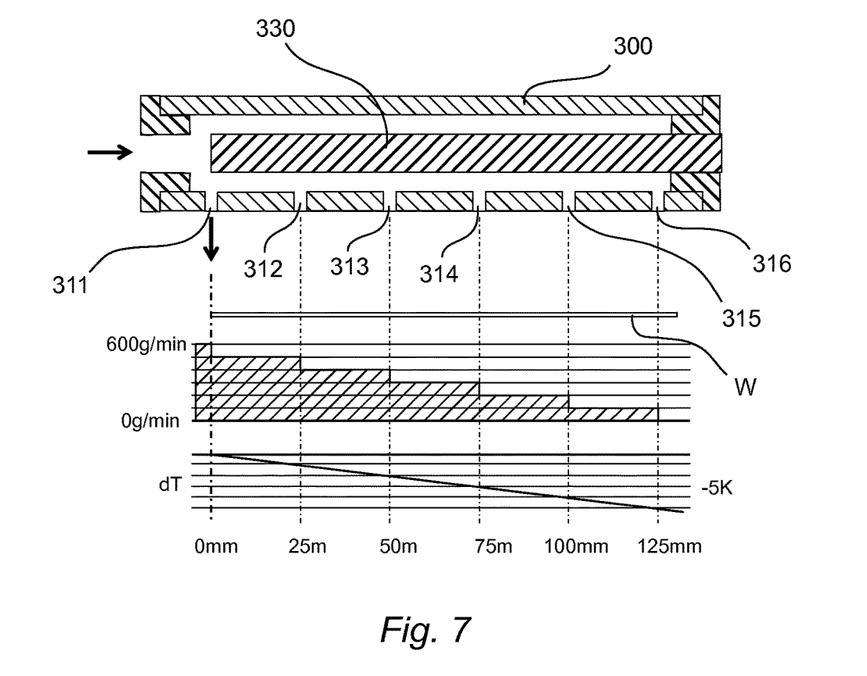
FIG. 7 is a schematic cross-sectional view of another liquid supply system according to the present invention, shown with an associated graph relating temperature and flow rate differentials with the nozzle and heater arrangement.

In FIG. 7, a manifold 300 has six liquid-dispensing nozzles 311-316, and includes a heating element 330. Heating element 330 is a gradient heater, which can be tuned to heat process liquid to a steadily greater degree as liquid proceeds from the left-side inlet of the manifold 300 toward each of the nozzles 311-316. The nozzles 311-316 are spaced from one another by 25 mm, starting from the center of a wafer W and extending adjacent its outer periphery.

For example, if the total flow of process liquid into manifold 300 is 600 g/min, and the outgoing flow through each nozzle 311-316 is 100 g/min, then, in the absence of an applied temperature gradient to the process liquid, the temperature of the liquid would steadily decrease from the initial temperature at nozzle 311, to a temperature that is cooler by 5K, at the nozzle 316.

That temperature drop can be compensated, however, through the application of a heat gradient along the heating element 330, as detailed in the following table:

| | |
|---|---|
| Specific Heat capacity | 4.187 J/K/g |
| Length of nozzle | 125 mm |
| no of holes | 6 |
| Required dT | 5° K |
| Sum flow | 600 g/min |
| dT 1st nozzle | 0° K |
| Flow 1st nozzle | 100 g/min |
| Flow after 1st nozzle | 500 g/min |
| dT 2nd Nozzle | 1° K |
| Energy needed before 2nd nozzle | 34.9 W |
| Flow 2nd nozzle | 100 g/min |
| Flow after 2nd nozzle | 400 g/min |
| dT 3rd nozzle | 2° K |
| Energy needed before 3rd nozzle | 27.9 W |
| Flow 3rd nozzle | 100 g/min |
| Flow after 3rd nozzle | 300 g/min |
| dT 4th Nozzle | 3° K |
| Energy needed before 4th nozzle | 20.9 W |
| Flow 4th nozzle | 100 g/min |
| Flow after 4th nozzle | 200 g/min |
| dT 5th nozzle | 4° K |
| Energy needed before 5th nozzle | 14.0 W |
| Flow 5th nozzle | 100 g/min |
| Flow after 5th nozzle | 100 g/min |
| dT 6th Nozzle | 5° K |
| Energy needed before 6th nozzle | 7.0 W |
| Flow 6th nozzle | 100 g/min |
| Total energy needed | 105.0 W |

Temperature drops of greater or lesser magnitudes can be compensated based on similar calculations of applied heating power.

Figure 8:
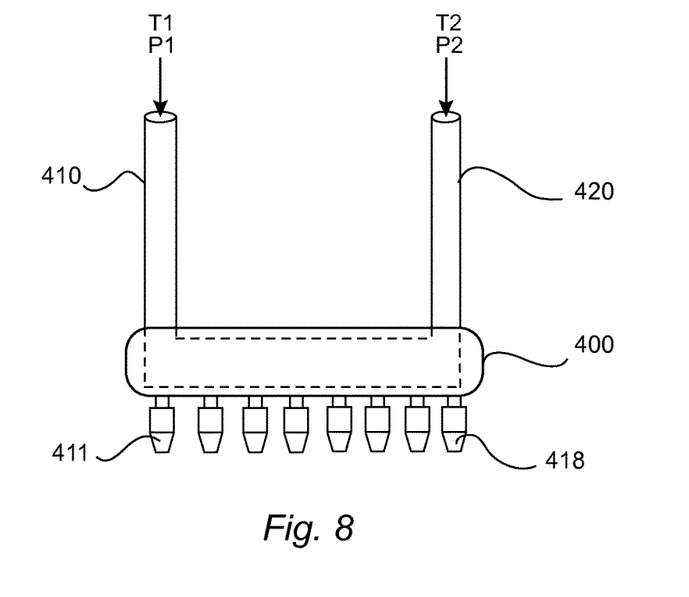
FIG. 8 is a schematic side view of yet another embodiment of a liquid supply system suitable for use in the methods and apparatus according to the present invention.

FIG. 8 shows another embodiment of a liquid supply system suitable for use in the methods and apparatus according to the present invention. In this embodiment, a common manifold 400 supplies process liquid to each of nozzles 411-418. However, rather than providing a heating element within the manifold 400, instead the manifold is provided with two inlets 410, 420, each of which receives a supply of a same process liquid but at respectively different temperatures T1, T2 and pressures P1, P2. In this manner, a controlled temperature gradient along nozzles 411-418 can be realized based upon competing backpressure.

Figure 9:
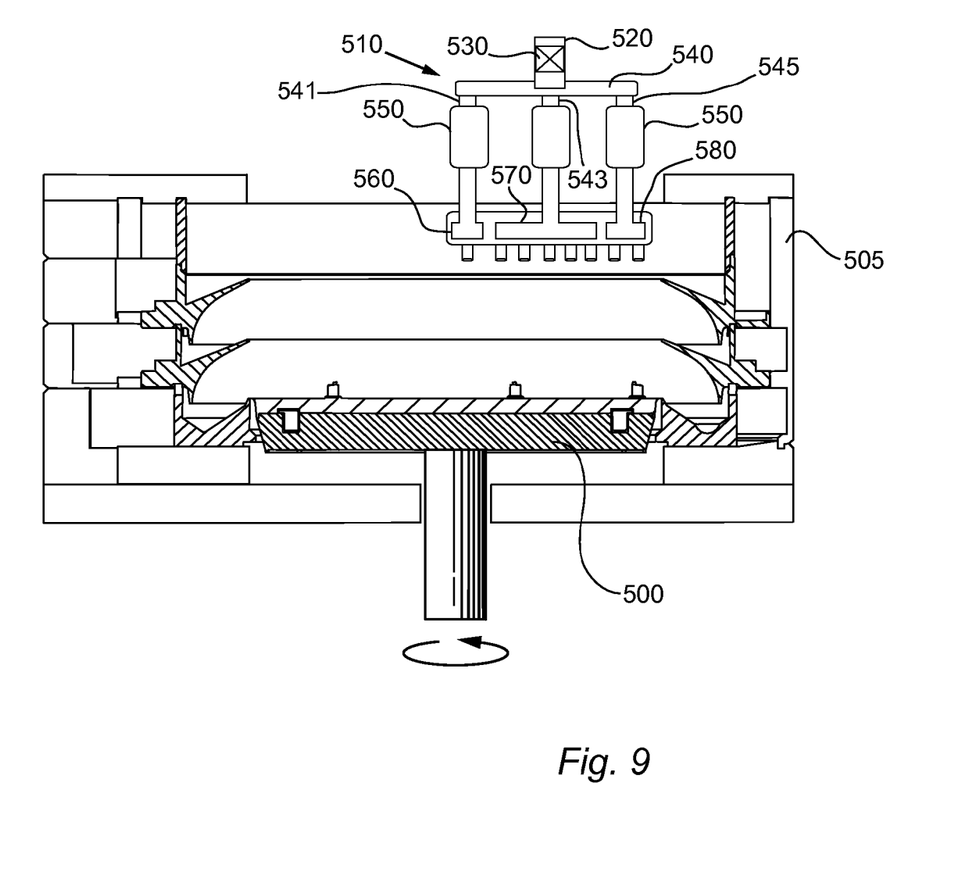
FIG. 9 is an explanatory cross-sectional side view of an apparatus according to a fourth embodiment of the invention.

Lastly, the embodiment of FIG. 9 shows another configuration of a nozzle assembly, utilized in conjunction with a spin chuck 500 and surrounding collector 505 as described in connection with FIG. 4-6. In this embodiment, the nozzle assembly terminates downwardly in a series of eight dispensing nozzles as shown in FIG. 9. Those dispensing nozzles are fixed relative to one another, but the overall nozzle assembly 510 is preferably vertically displaceable relative to the collector 505, and may also be horizontally displaceable, either in a linear manner or along an arcuate path as described in connection with the boom swing arms of the FIGS. 4-6 embodiment.

It will also be appreciated that, although the nozzle assembly 510 of FIG. 9 is used in this embodiment in conjunction with an open processing environment, it could also be utilized in connection with a sealed process chamber as in the embodiment of FIGS. 2 and 3, in which case the nozzle assembly 510 could be built into the lid 36 of the process chamber.

In the FIG. 9 embodiment, process liquid is supplied to the nozzle assembly 510 through a common inlet conduit 520. Conduit 520 is equipped with a computer-controlled valve 530. In this embodiment there are no valves downstream of valve 530, so all of the eight discharge nozzles are supplied simultaneously. The inlet conduit 520 feeds process liquid to a first manifold 540, from which the liquid is fed into three separate conduits 541, 543, 545 that are arranged in parallel. Each conduit 541, 543, 545 is equipped with its own in-line heater 550, and each of these heaters is controlled individually so as to impart a desired temperature profile to the process liquid in the three conduits 541, 543, 545. These heaters 550 need not be of especially high capacity, as it is typically sufficient in practice that they be capable of changing the temperature of the process liquid over a range of only about +/−10° C.

Conduits 541, 543, 545 lead to downstream manifolds 560, 570, 580, respectively, with manifold 560 supplying a central discharge nozzle, manifold 570 supplying a linear array of five discharge nozzles extending across a middle portion of a wafer, and manifold 580 supplying a pair of peripheral discharge nozzles.

As in the embodiment of FIGS. 4-6, this embodiment may also be equipped with an IR camera mounted on the apparatus, so that the whole wafer is in view, whereby the temperature gradient across the wafer surface can be visualized and/or algorithmically analyzed. A feedback loop can be created to control each of the three heaters 550, to achieve optimum temperature uniformity of the process liquid on the wafer.

The foregoing examples make plain to those skilled in the art that the apparatus and methods according to the present invention permit a wide range of tuning of temperatures and liquid flows to particular process requirements. Within the basic arrangement of utilizing two or more nozzles, it is possible to supply those nozzles with the same chemistry and concentration but at different temperatures; the same chemistry and temperature, but at different concentrations; or different chemistries at different temperatures.

Moreover the at least two nozzles can be mounted at fixed locations above the wafer; fixed relative to one another on a movable dispensing arm; or on independently movable dispensing arms.

What is claimed is:

1. An apparatus for processing a wafer, the apparatus comprising:
   a rotary chuck adapted to hold and rotate the wafer about an axis of rotation;
   first and second liquid-dispensing nozzles mounted at a fixed distance from one another, wherein the first liquid-dispensing nozzle is positioned closer to the axis of rotation than the second liquid-dispensing nozzle;
   a liquid supply system configured to supply a same process liquid via a same inlet conduit to the first liquid-dispensing nozzle and the second liquid-dispensing nozzle,
   wherein
      the liquid supply system comprises one or more heaters, and
      the one or more heaters are configured to heat at least one of
         a first portion of the process liquid dispensed from the first liquid-dispensing nozzle to a first temperature, or
         a second portion of the process liquid dispensed from the second liquid-dispensing nozzle to a second temperature, and
      a difference between the first temperature and the second temperature is within a predetermined range; and
   a manifold,
   wherein
      the one or more heaters include a single heater,
      the single heater is disposed within the manifold and extends from a first end of the manifold and across the first liquid-dispensing nozzle and the second liquid dispensing nozzle,
      the process liquid enters the manifold at a second end of the manifold, passes across the single heater and to the first liquid-dispensing nozzle and the second liquid-dispensing nozzle,
      the second end is opposite the first end,
      the first liquid-dispensing nozzle is closer to the second end than the second liquid-dispensing nozzle, and
      the single heater heats the first portion of the process liquid more than the second portion of the process liquid.

* * * * *